(12) United States Patent
Su et al.

(10) Patent No.: US 11,522,007 B2
(45) Date of Patent: Dec. 6, 2022

(54) DISPLAY PANEL AND DISPLAY DEVICE

(71) Applicant: Shanghai Tianma Micro-Electronics Co., Ltd., Shanghai (CN)

(72) Inventors: Xiaoyue Su, Shanghai (CN); Yang Zeng, Shanghai (CN); Shihao Tang, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 16/911,087

(22) Filed: Jun. 24, 2020

(65) Prior Publication Data
US 2021/0305314 A1    Sep. 30, 2021

(30) Foreign Application Priority Data
Mar. 31, 2020 (CN) .......................... 202010246155.9

(51) Int. Cl.
  *H01L 27/15* (2006.01)
  *H01L 33/06* (2010.01)
  *H01L 33/50* (2010.01)
(52) U.S. Cl.
  CPC ............ *H01L 27/156* (2013.01); *H01L 33/06* (2013.01); *H01L 33/50* (2013.01)

(58) Field of Classification Search
CPC combination set(s) only.
See application file for complete search history.

(56) References Cited

U.S. PATENT DOCUMENTS

| | | | |
|---|---|---|---|
| 2020/0212124 A1* | 7/2020 | Shao | H01L 27/3246 |
| 2020/0357863 A1* | 11/2020 | Nakamura | H01L 27/3276 |
| 2021/0050388 A1* | 2/2021 | Song | H01L 27/322 |

FOREIGN PATENT DOCUMENTS

| | | |
|---|---|---|
| CN | 101051648 A | 10/2007 |
| CN | 108933153 A | 12/2018 |

* cited by examiner

*Primary Examiner* — Ratisha Mehta
(74) *Attorney, Agent, or Firm* — Alston & Bird LLP

(57) ABSTRACT

The present disclosure provides a display panel and a display device. The display panel includes: a base substrate; a plurality of micro-LED groups located on the base substrate, wherein each of the plurality of micro-LED groups includes at least three micro-LEDs, and at least two micro-LEDs of each said micro-LED group have their longer sides arranged in different directions; and a shielding layer comprising a plurality of apertures located in shielding portions, wherein the shielding portions are located between adjacent micro-LEDs, and wherein the plurality of apertures each correlates one of the micro-LEDs.

19 Claims, 9 Drawing Sheets

DISPLAY PANEL AND DISPLAY DEVICE

CROSS-REFERENCE TO RELATED APPLICATIONS

The present application claims priority to Chinese Patent Application No. CN 202010246155.9, filed on Mar. 31, 2020, the content of which is incorporated herein by reference in its entirety.

TECHNICAL FIELD

The present disclosure relates to the field of display technologies, and in particular, to a display panel and a display device.

BACKGROUND

Light-emitting diodes (LEDs) have been widely applied in lighting, visible light communication and light-emitting display scenarios from their advantages such as low cost, high light efficiency, energy saving therefore benefiting the environment. t. A micro-LED is formed by shrinking traditional LEDs and pack them in an array spaced at micro-scale distances, thereby achieving an ultra-high resolution in a micro-LED display. In this way, the micro-LED can be used in the display field. Compared with traditional liquid crystal display (LCD) and organic light-emitting display (OLED), micro-LED display has advantages such as a long luminescence lifetime, a high brightness, a thin and light volume, a low power consumption, a high pixel density, and the like. Thus, the micro-LED display has become the representative of a third generation display technology which has high authenticity, interactive and personalized display as its main features.

At present, the commonly used micro-LED display achieves color display by shining light emitted from a micro-LED chip onto quantum dot materials to excite emission. However, this technology needs to solve a problem of the low efficiency from color conversion and light extraction efficiency of quantum dot materials. Therefore, a thick quantum dot material is preferred, however this might lead to crosstalk between adjacent pixels, thereby affecting a display quality.

SUMMARY

In a first aspect, an embodiment of the present disclosure provides a display panel, including: a base substrate; a plurality of micro-LED groups located on the base substrate, wherein each of the plurality of micro-LED groups comprises at least three micro-LEDs, and wherein at least two micro-LEDs in each said micro-LED group have their longer sides arranged in different directions; and a shielding layer comprising a plurality of apertures located in shielding portions. The shielding portions are located between adjacent micro-LEDs, and the plurality of apertures each correlates one of the micro-LEDs.

In a second aspect, an embodiment of the present disclosure provides a display device including the display panel described in the first aspect.

BRIEF DESCRIPTION OF DRAWINGS

In order to illustrate technical solutions of embodiments of the present disclosure, the accompanying drawings used in the embodiments or the prior art are introduced hereinafter. Obviously, these drawings illustrate some embodiments of the present disclosure. On the basis of these drawings, those skilled in the art can also obtain other drawings without paying any creative effort.

DESCRIPTION OF EMBODIMENTS

In order to better understand technical solutions of the present disclosure, the embodiments of the present disclosure will be described in details with reference to the drawings.

It should be clear that the described embodiments are merely part of the embodiments of the present disclosure rather than all of the embodiments. All other embodiments obtained by those skilled in the art without paying creative labor shall fall into the protection scope of the present disclosure.

The terms used in the embodiments of the present disclosure are merely for the purpose of describing specific embodiments, rather than limiting the present disclosure. The singular form "a", "an", "the" and "said" used in the embodiments and claims shall be interpreted as also including the plural form, unless indicated otherwise in the context.

It should be understood that, the term "and/or" is used in the present disclosure merely to describe relations between associated objects, and thus includes three types of relations. That is, A and/or B can represent: (a) A exists alone; (b) A and B exist at the same time; or (c) B exists alone. In addition, the character "/" generally indicates "or".

In the description of this specification, it should be understood that the terms such as "substantially", "basically", "approximately", "about", "almost" and "roughly" described in the claims and embodiments of the present disclosure indicate a value that can be generally agreed within a reasonable process operation range or tolerance range, rather than an exact value.

It should be understood that, while apertures and light sources may be described using terms such as "first", "second" and "third" in the embodiments of the present disclosure, they are not limited by these terms, which are used for distinguishing the apertures from one another and distinguishing the light sources from one another. For example, a first aperture may also be referred to as a second aperture, without departing from the scope of the embodiments of the present disclosure. Likewise, a second aperture may be referred to as a first aperture.

The inventors of the present disclosure have studied the problems with the related art carefully and thoroughly to provide a solution.

Figure 1:
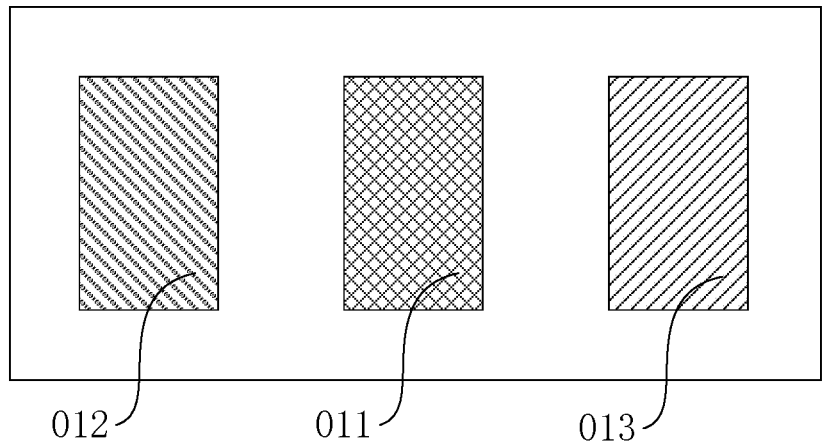
FIG. 1 illustrates an arrangement of pixels of micro-LED display according to an embodiment of the present disclosure.
Figure 3:
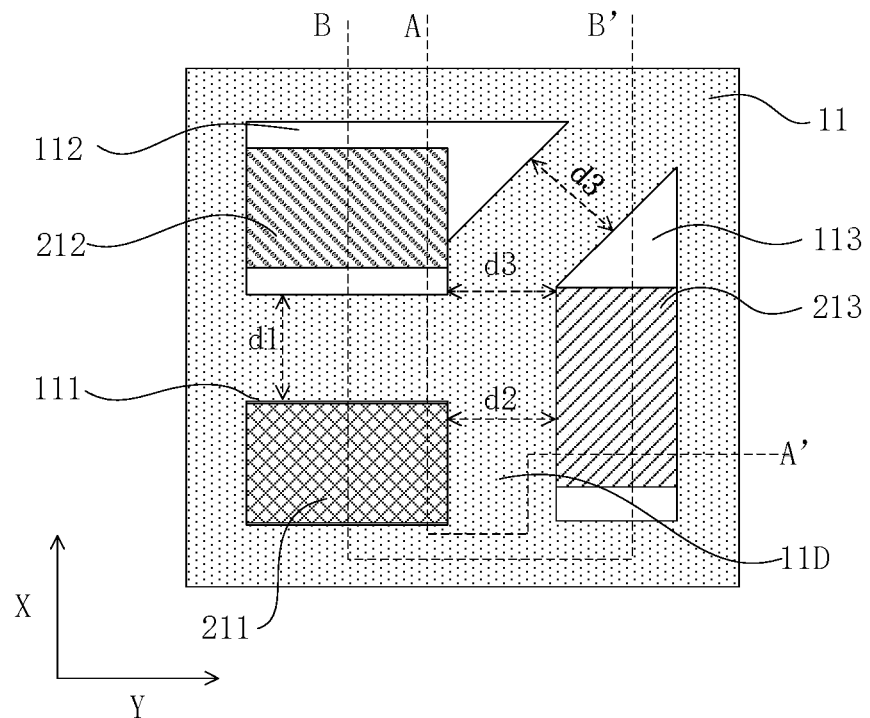
FIG. 3 is a schematic diagram of a part of a display panel according to an embodiment of the present disclosure.

FIG. 1 illustrates an arrangement of pixels of micro-LED display according to an embodiment of the present disclosure. FIG. 1 illustrates one pixel unit including pixels emitting light of three different colors: a red pixel that emits red light, a blue pixel that emits blue light, and a green pixel that emits green light. A light-emitting manner illustrated in FIG. 1 is a manner in which micro-LEDs cooperate with quantum dots. The pixels of three different colors in a pixel unit include corresponding micro-LEDs 011, 012, and 013 and corresponding quantum dot conversion layers located at light-emitting side of the micro-LEDs. In order to achieve a high light conversion efficiency, the quantum dot conversion layer is usually thick. In this case, it is necessary to provide a shielding structure between every adjacent pixels, so as to prevent cross talk—light emitted by a micro-LED of one pixel arriving at the quantum dot conversion layer of another pixel. In addition, the arrangement of the micro-LEDs 011, 012, and 013 illustrated in FIG. 1 also corresponds to an arrangement of the pixels. However, with the arrangement of the pixels as shown in FIG. 1, in a case of a determined area of one pixel unit, i.e., in a case of a constant pixel density, a spacing between two pixels is too small to meet a requirement for a barrier of certain width. As shown in FIG. 3, spacings between the three pixels arranged in a row direction are too small. If a spacing between the pixels is sufficient for the barrier, the area of one pixel unit will increase to result in a decreased pixel density, or a light-emitting area of each pixel in one pixel unit will decrease to result in a decreased light-emitting brightness.

Figure 2:
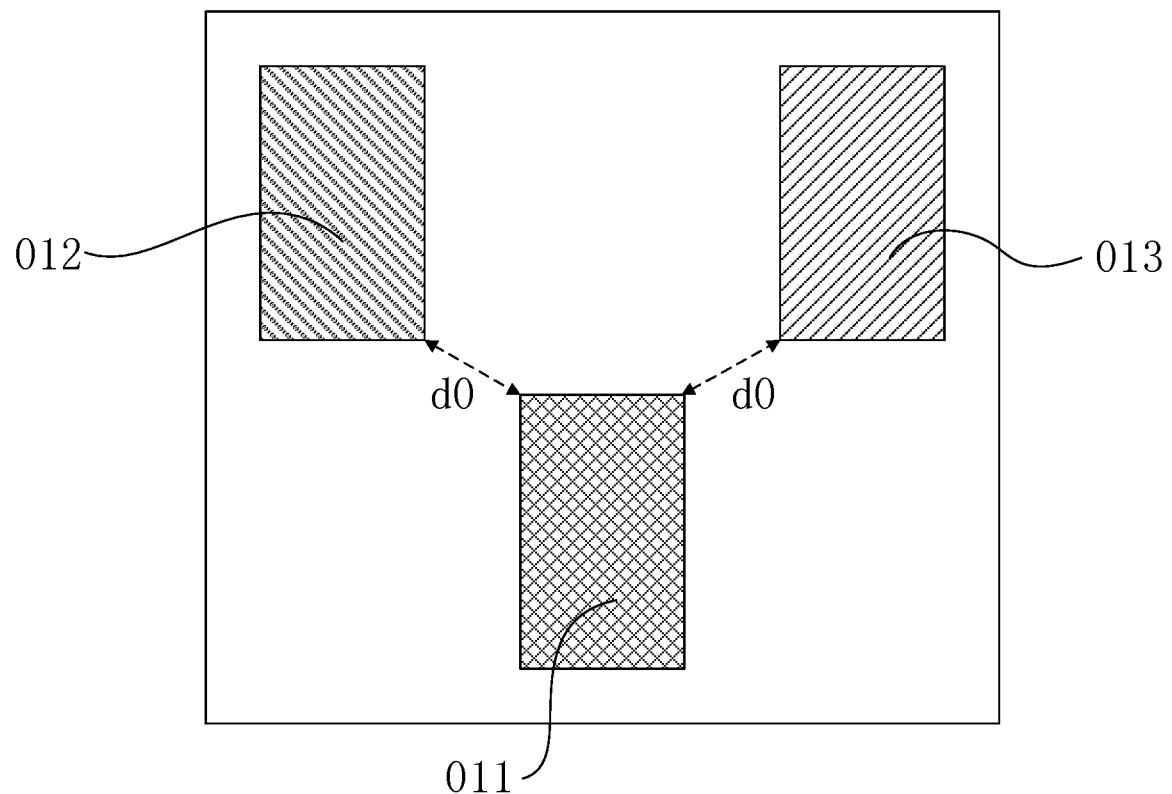
FIG. 2 illustrates another arrangement of pixels of micro-LED display according to an embodiment of the present disclosure.

FIG. 2 illustrates another arrangement of pixels of micro-LED display according to the inventor of the present disclosure during a research process. FIG. 2 illustrates another arrangement of pixels of micro-LED display provided by the inventor of the present disclosure during a research process. As shown in FIG. 2, when three pixels in one pixel unit are respectively arranged at three vertices of an equilateral triangle, the inventor found that a spacing between the pixels can be relatively increased. In other words, a barrier having a certain width can be basically arranged between the pixels. However, when the arrangement shown in FIG. 2 is adopted, a width of the spacing between the pixels is not uniform. For example, for the three pixels, a distance d0 between a top vertex of a top pixel (the pixel corresponding to a bottom micro-LED 012) and a vertex of each of the other two pixels that is closest to the top vertex of the top pixel is too small. As a result, the width of the barrier at this position cannot meet the requirement.

In view of the problems described above, the embodiments of the present disclosure provide a display panel and a display device, which can increase the light-emitting area of the pixel and achieve a required display chromaticity without causing a color mixing problem when a barrier is arranged between the pixels.

Figure 4:
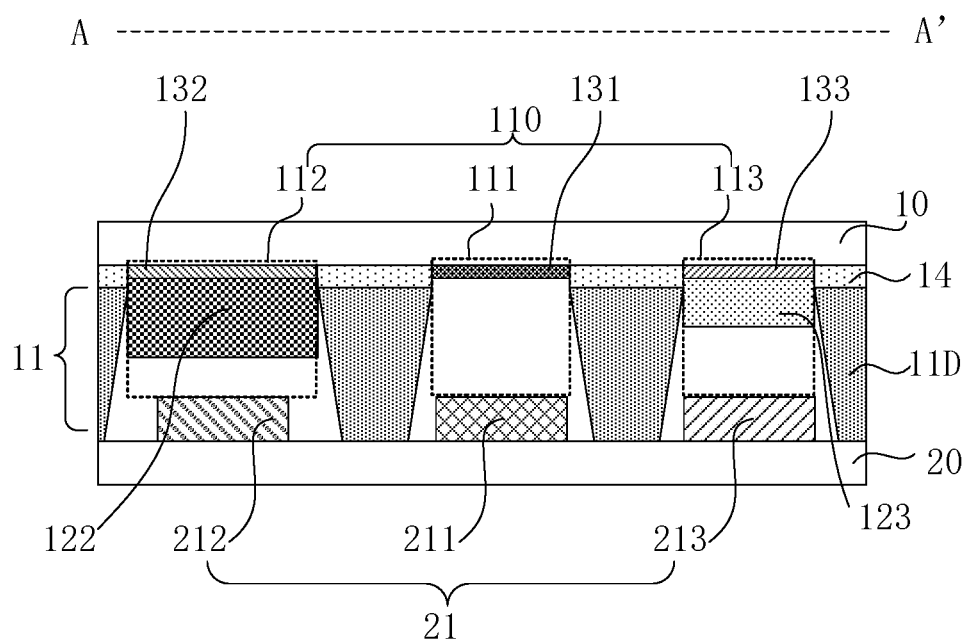
FIG. 4 is a cross-sectional view along AN line shown in FIG. 3.
Figure 5:
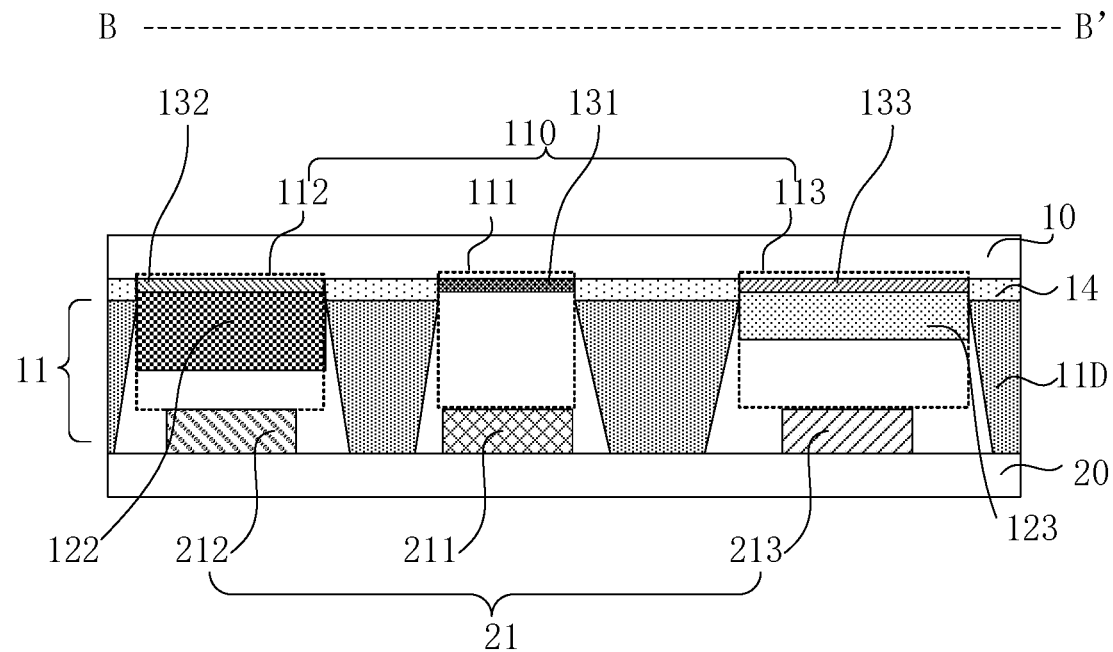
FIG. 5 is a cross-sectional view along BB' line shown in FIG. 3.

FIG. 3 is a schematic diagram of a part of a display panel according to an embodiment of the present disclosure. FIG. 4 is a cross-sectional view along AN line shown in FIG. 3. FIG. 5 is a cross-sectional view along BB' line shown in FIG. 3. Although from FIG. 3 to FIG. 5 only one pixel unit of the display panel is illustrated, and it is understood that the display panel includes a plurality of pixel units. With reference to FIG. 3 to FIG. 5, the display panel according to the embodiment of the present disclosure includes a base substrate 20 and a plurality of micro-LED groups 21 disposed on the base substrate 20. In addition, the display panel may further include a counter substrate 10 that is disposed oppositely to the base substrate 20, and the micro-LED groups 21 are disposed at a side of the base substrate 20 facing towards the counter substrate 10.

Each micro-LED group 21 includes at least three micro-LEDs, and at least two micro-LEDs of the micro-LED group 21 have different length. As shown in FIG. 3 to FIG. 5, in an example of the present disclosure, each micro-LED group 21 includes three micro-LEDs. That is, each micro-LED group 21 includes a first micro-LED 211, a second micro-LED 212, and a third micro-LED 213. As shown in FIG. 3, two of the three micro-LEDs have different orientations. For example, the first micro-LED 211 and the third micro-LED 213 have different orientations. It should be noted that the micro-LED involved in this embodiment of the present disclosure refers to a LED grown on a wafer, and a dimension of the micro-LED can be controlled to be within a range from 1 μm to 10 μm. That is, the micro-LEDs involved in the embodiments of the present disclosure are micro light-emitting diodes. Further, a cathode and an anode of each micro-LED may be arranged in the longer side of the micro-LED. In addition, the micro-LED according to this embodiment of the present disclosure has a shape having a long axis and a short axis, such as a rectangle shape, an ellipse shape, etc. In this way, the longer side of the micro-LED is in a direction in which the long axis is located. The shape of the micro-LED may be the same as a shape of a circle.

The display panel further includes a shielding layer 11, which includes a shielding portion 11D and a plurality of apertures. The shielding portion 11D is located between adjacent micro-LEDs, and the apertures one-to-one correspond to the micro-LEDs. The aperture of the shielding layer 11 is a light-transmitting region where light can pass through, and the shielding portion 11D of the shielding layer 11 is a light-shielding region. That is, the shielding layer 11 includes a region where light can pass through, and a region where light is shielded. An area of the aperture determines a light-emitting area of the pixel.

It should be noted that the shielding layer 11 may be arranged on the base substrate 20 or on the counter substrate 10, and either way will fall into a scope of the present disclosure. It should be noted that if the shielding layer is arranged on the base substrate 20, then the shielding layer 11 is arranged at a side of the base substrate 20 facing towards the counter substrate 10. If the shielding layer is arranged on the counter substrate 10, then the shielding layer 11 may be arranged at a side of the counter substrate 10 facing towards the base substrate 20.

In this embodiment of the present disclosure, some of the micro-LEDs have different orientations, so that in a case of a determined area of the pixel area, a large enough spacing between the micro-LEDs can be achieved by providing a reasonable arrangement of the micro-LEDs. In this way, the shielding portion 11D having an appropriate width can be provided, thereby avoiding the color mixing problem. In order to achieve a required aperture ratio of the display panel, the pixel unit shall not have an extremely large length in any direction. If the pixels in the pixel unit are arranged side by side along only one direction, then the spacing between the pixels is determined. Since the shielding portion 11D having a large width is required for the micro-LED display, there will be no sufficient space for arranging the shielding portion 11D having a required width. If the shielding portion 11D having a required width is provided in the arrangement of pixels as shown in FIG. 1, either the aperture ratio of the pixels is sacrificed, or the dimension of the pixel unit is increased, both of which will not be desired. However, in the embodiments of the present disclosure, the pixels in the pixel unit are arranged in a misaligned manner, so that the spacing between the pixels can be reasonably designed without increasing the dimension of the pixel unit.

Further, the plurality of apertures include aperture groups 110, and the aperture groups 110 one-to-one correspond to the micro-LED groups 21. Each of the aperture groups 110 includes a first aperture 111, a second aperture 112, and a third aperture 113. The first aperture 111 correlates to the first micro-LED 211, the second aperture 112 correlates to the second micro-LED 212, and the third aperture 113 correlates to the third micro-LED 213. A projection of the first aperture 111 onto the base substrate 20 does not cover a projection of the corresponding first micro-LED 211 onto the base substrate 20, a projection of the second aperture 112 onto the base substrate 20 does not cover a projection of the corresponding second micro-LED 212 onto the base substrate 20, and a projection of the third aperture 113 onto the base substrate 20 does not cover a projection of the third micro-LED 213 onto the base substrate 20. The light from the first micro-LED 211 is directly emitted from the first aperture 111 or emitted from the first aperture 111 after light conversion, the light from the second micro-LED 212 is emitted directly from the second aperture 112 or emitted from the second aperture 112 after light conversion, and the light from the third micro-LED 213 is directly emitted from the third aperture 113 or emitted from the third aperture 113 after light conversion.

It should be noted that for the display panel provided in this embodiment, each micro-LED group 21 correlates to a respective one pixel unit, and each aperture group 110 correlates to a respective one pixel unit. In other words, each pixel unit includes the first micro-LED 211, the second micro-LED 212, and the third micro-LED 213, and each pixel unit includes the first aperture 111, the second aperture 112 and the third aperture 113.

As shown in FIG. 3, in an embodiment of the present disclosure, each shielding portion 11D between adjacent micro-LEDs in the micro-LED group 21 has a same width. That is, a spacing between of any two apertures of the first aperture 111, the second aperture 112, and the third aperture 113 is equal to each other. That is, in one aperture group 110, a distance between an edge of the first aperture 111 close to the second aperture 112 and an edge of the second aperture 112 close to the first aperture 111 is a first distance d1, a distance between an edge of the first aperture 111 close to the third aperture 113 and an edge of the third aperture 113 close to the first aperture 111 is a second distance d2, and a distance between an edge of the second aperture 112 close to the third aperture 113 and an edge of the third aperture 113 close to the second aperture 112 is a third distance d3. The first distance d1, the second distance d2, and the third distance d3 are equal to each other. As shown in FIG. 3, a width of the shielding portion 11D between the first aperture and the second aperture is d1, a width of the shielding portion 11D between the first aperture 111 and the third aperture 113 is d2, and a width of the shielding portion 11D between the second aperture 112 and the third aperture 113 is d3, where d1=d2=d3.

In one pixel unit, a width of each shielding portion 11D between adjacent apertures is identical. That is, in one aperture group 110, spacings between different apertures are equal to each other. In an example, this width may be a minimum width for avoiding color mixing of adjacent pixels having different colors. Then, in a case of a determined are of the pixel unit, the light-transmitting region of the pixel can be increased. In a case a determined light-transmitting area of the pixel, the area of the pixel unit can be decreased, and the pixel density can be increased.

In addition, in an embodiment, in an aperture group 110 corresponding to one micro-LED group 21, adjacent edges of adjacent apertures are parallel to each other. In other words, in one pixel unit, adjacent edges of the first aperture 111, the second aperture 112, and the third aperture 113 are parallel to each other. As shown in FIG. 3, in one aperture group 110, the edge of the first aperture 111 close to the second aperture 112 is parallel to the edge of the second aperture 112 close to the first aperture 111, the edge of the first aperture 111 close to the third aperture 113 is parallel to the edge of the third aperture 113 close to the first aperture 111, and the edge of the second aperture 112 close to the third aperture 113 is parallel to the edge of the third aperture 113 close to the second aperture 112.

With further reference to FIG. 3, in one micro-LED group 21, the first micro-LED 211, the second micro-LED 212 and the third micro-LED 213 are respectively arranged at three vertices of a triangle. The first micro-LED 211 and the second micro-LED 212 may be arranged in a first direction X. The first micro-LED 211 and the second micro-LED 212, as an entirety, and the third micro-LED 213 are arranged in a second direction Y. For example, the third micro-LED 213 and the first micro-LED 211 are arranged in the second direction Y, and the third micro-LED 213 and the second micro-LED 212 are arranged in the second direction Y. Alternatively, only the third micro-LED 213 and the first micro-LED 211 are arranged in the second direction Y, or only the third micro-LED 213 and the second micro-LED 212 are arranged in the second direction Y. Herein, the first direction X intersects the second direction Y. For example, the first direction X is perpendicular to the second direction Y.

Figure 6:
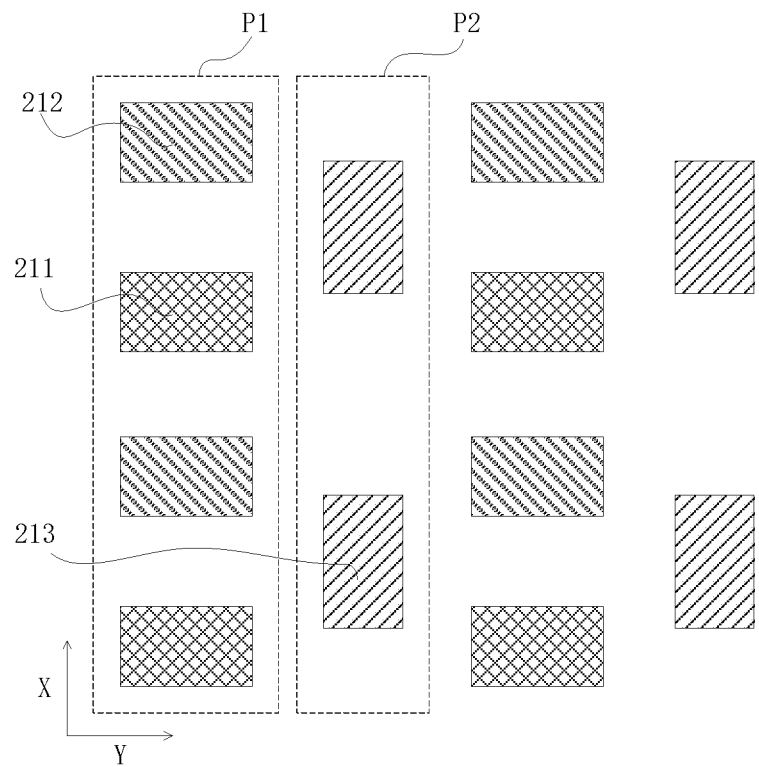
FIG. 6 illustrates an arrangement of micro-LEDs according to an embodiment of the present disclosure.

FIG. 6 illustrates an arrangement of micro-LEDs according to an embodiment of the present disclosure. In an embodiment, as shown in FIG. 6, the micro-LEDs are arranged in an array. The first micro-LED 211 and the second micro-LED 212 are alternately arranged in the first direction X to form a first pixel column P1, and the third micro-LEDs 213 are arranged in the first direction X to form a second pixel column P2. The first pixel column P1 and the second pixel column P2 are alternately arranged in the second direction Y. In the second direction Y, the third micro-LED 213 correlates to a spacing between the first micro-LED 211 and the second Micro-LED 212.

The longer side of the third micro-LED 213 is parallel to the first direction X, and the longer side of the first micro-LED 211 is parallel to the second direction Y. In other words, the longer side of the first micro-LED 211 is the same as the width direction of the third micro-LED 213. Then, in the second direction, a sum of the dimension of the first micro-LED 211 and the dimension of the third micro-LED has the smallest value. Therefore, in a case of a determined width of each aperture, there is a sufficient space for arranging the shielding portion 11D. Alternatively, in a case of a determined width of the shielding portion 11D, the area of the aperture can be increased.

With reference to FIG. 4 and FIG. 5, in an embodiment of the present disclosure, the micro-LED is a micro-LED that emits light of a first color. That is, the first micro-LED 211, the second micro-LED 212, and the third micro-LED 213 in the micro-LED group 21 emit light of the first color. As an example, the first micro-LED 211, the second micro-LED 212, and the third micro-LED 213 are micro-LEDs having a same dimension and a same shape. In addition, the display panel further includes a second color quantum dot conversion layer 122 and a third color quantum dot conversion layer 123. The second color quantum dot conversion layer 122 correlates to the second micro-LED 212, and the third color quantum dot conversion layer123 correlates to the third micro-LED 213. The light of the first color emitted by the second micro-LED 212 excites the second color quantum dot conversion layer 122 to emit light of a second color, and the light of the first color emitted by the third micro-LED 213 excites the third color quantum dot conversion layer 123 to emit light of a third color. Herein, the light of the first color, the light of the second color and the light of the third color have different wavelengths.

In an example, the wavelength of the light of the first color is smaller than the wavelength of the light of the second color and smaller than the wavelength of the light of the third color. That is, the second color quantum dot conversion layer 122 and the third color quantum dot conversion layer 123 are excited by the light of the first color (having large energy), so as to generate the light of the second color and the light of the third color (having lower energy).

Correspondingly, with reference to FIG. 3, an area of the first aperture 111 is smaller than an area of the second aperture 112, and the area of the first aperture 111 is smaller than an area of the third aperture 113. Since the wavelength of the light of the second color and the wavelength of the light of the third color each are smaller than the wavelength of the light of the first color, in order to achieve white light, a brightness of the light of the second color and a brightness of the light of the third color each shall be larger than a brightness of the light of the first color. Meanwhile, the light of the first color is emitted to the first aperture 111 without light conversion by the quantum dot conversion layer, and the light of the second color and light of the third color each are obtained by the light of the first color exciting the quantum dot conversion layer. A conversion efficiency has an affection on conversion of the light. Therefore, the area of the first aperture 111 may be smaller than the area of the second aperture 112 and the area of the third aperture 113 respectively corresponding to the light of the second color and the light of the third color.

Further, as shown in FIG. 3, the length of the first aperture 111 in the second direction Y is larger than the width of the first aperture 111 in the first direction X, the length of the third aperture 113 in the first direction X is larger than the width of the third aperture 113 in the second direction. In other words, the longer side of the first aperture 111 is the same as the width direction of the third aperture 113. Then, in the second direction Y, a sum of the dimension of the first aperture 111 and a dimension of the third aperture 113 has a smallest value, and the space between the apertures is sufficient for arranging the shielding portion 11D having a required width.

Further, with further reference to FIG. 3, the length of the first aperture 111 in the second direction Y is equal to the length of the first micro-LED 211, and the width of the third aperture 113 in the second direction Y is equal to the width of the third micro-LED 213.

The length of the first aperture 111 in the second direction Y is substantially equal to the length of the first micro-LED 211 in the second direction Y. That is, in a case of a determined shape and a determined dimension of the first micro-LED 211, the length of the first aperture 111 can be determined based on the length of the first micro-LED 211. It should be understood that the length of the first aperture 111 being substantially equal to the length of the first micro-LED 211 correlates to a minimum length for preventing the light emitted by the first micro-LED 211 from being blocked by the shielding layer 11. Therefore, the length of the first aperture 111 in the second direction Y is equal to the length of the first micro-LED 211 in the second direction Y. On the one hand, a required light output ratio of the pixel corresponding to the first aperture 111 and the first micro-LED 211 can be achieved. On the other hand, the length of the first aperture 111 can be as small as possible, so that there will be a sufficient spacing between adjacent pixels in the pixel unit in the second direction Y for arranging the shielding portion 11D, thereby avoiding color mixing.

In an embodiment, as shown in FIG. 3, the width of the first aperture 111 in the first direction X is equal to the width of the first micro-LED 211 in the first direction X. That is, in a case of a determined shape and a determined dimension of the first micro-LED 211, the width of the first aperture 111 can be determined based on the width of the first micro-LED 211. It should be understood that the width of the first aperture 111 being equal to the width of the first micro-LED 211 correlates to a minimum width for preventing the light emitted by the first micro-LED 211 from being blocked by the shielding layer 11. Therefore, the width of the first aperture 111 in the first direction X is equal to the width of the first micro-LED 211 in the first direction X. On the one hand, a required light output ratio of the pixel corresponding to the first aperture 111 and the first micro-LED 211 can be achieved. On the other hand, the width of the first aperture 111 can be as small as possible, so that there will be a sufficient spacing between adjacent pixels in the pixel unit in the first direction X for arranging the shielding portion 11D, thereby avoiding color mixing.

Further, the shape and the dimension of the first aperture 111 may be substantially the same as the shape and the dimension of the corresponding first micro-LED 211, and the first aperture 111 completely exposes the first micro-LED 211. Since the color of the light emitted from the pixel corresponding to the first micro-LED 211 is the same as the color of the first micro-LED 211, a quantum dot conversion layer may not be provided in the first aperture 111 corresponding to the first micro-LED 211. There is a small loss for the light of the first color emitted by the first micro-LED 211 after being emitted from the first aperture 111, so the dimension of the first aperture 111 can be designed to be the same as the dimension of the first micro-LED 211. In this way, a spacing between the first aperture 111 and another aperture can be larger, or the area of the pixel unit can be decreased to increase the pixel density in a case of a determined spacing between the first aperture 111 and another aperture.

The width of the third aperture 113 in the second direction Y is the same as the width of the third micro-LED 213 in the second direction Y. Then in a case of a determined shape and a determined dimension of the third micro-LED 213, the width of the third aperture 113 can be determined based on the width of the third micro-LED 213. It should be understood that the width of the third aperture 113 being equal to the width of the third micro-LED 213 correlates to a minimum width for preventing the light emitted by the third micro-LED 213 or the light of the third color emitted by exciting the third color quantum dot conversion layer 123 by the third micro-LED 213 from being blocked by the shielding layer 11. Therefore, the width of the third aperture 113 in the second direction Y is equal to the width of the third micro-LED 213 in the second direction Y. On the one hand, a required light output ratio of the pixel corresponding to the third aperture 113 and the third micro-LED 213 can be achieved. On the other hand, the third aperture 113 is disposed at the side of the first aperture 111 and the second aperture 112, and therefore, the length of the third aperture 113 in the first direction X can be adjusted appropriately, thereby achieving a required light-emitting area of the pixel corresponding to the third aperture 113 and the third micro-LED 213. In addition, the width of the third aperture 113 can be as small as possible, so that there is a sufficient spacing between adjacent pixels in the pixel unit in the second direction Y for arranging the shielding portion 11D, thereby avoiding color mixing.

The width of the second aperture 112 in the first direction X may be larger than the width of the second micro-LED 212 in the first direction X. By appropriately increasing the width of the second aperture 112 in the first direction X, the area of the second aperture 112 can be increased, that is, the light-emitting area of the pixel corresponding to the second aperture 112 can be increased.

In an embodiment of the present disclosure, the wavelength of the light of the second color is larger than the wavelength of the light of the third color, and the area of the second aperture 112 is larger than the area of the third aperture 113. In an example, the light of the first color is blue light, the light of the second color is red light, and the light of the third color is green light. Then, the micro-LED is a blue micro-LED that emits blue light, the second color quantum dot conversion layer 122 is a red quantum dot conversion layer corresponding to the second micro-LED 212, and the third color quantum dot conversion layer 123 is a green quantum dot conversion layer corresponding to the third micro-LED 213. Correspondingly, the second micro-LED 212 excites the red quantum dot conversion layer in such a manner that the pixel corresponding to the second aperture 112 emits red light, and the third micro-LED 213 excites the green quantum dot conversion layer 123 in such a manner that the pixel corresponding to the third aperture 113 emits green light. In addition, no quantum dot conversion layer is required in the first aperture 111, and the blue light emitted by the first micro-LED 211 can cause the pixel corresponding to the first aperture 111 to emit blue light. By setting the second aperture 112 corresponding to the light of the second color that has the largest wavelength to have a maximum area, the brightness of the light of the second color that has a low energy can be increased, thereby facilitating adjustment of white light.

In addition, it is also possible that not all of the micro-LEDs are blue micro-LEDs. For example, the first micro-LED may be a blue micro-LED, the second micro-LED may be a red micro-LED, and the third micro-LED may be a green micro-LED. Correspondingly, the first aperture 111 may be provided with a blue quantum dot conversion layer and the corresponding pixel emits blue light, the second aperture 112 may be provided with a red quantum dot conversion layer and the corresponding pixel emits red light, and the third aperture 113 may be provided with a green quantum dot conversion layer and the corresponding pixel emits green light.

In addition, the first micro-LED may be a blue micro-LED, the third micro-LED may be a green micro-LED, the second micro-LED may be a blue micro-LED or a green micro-LED, and the corresponding second aperture 112 may be provided with a red quantum dot conversion layer and the corresponding pixel emits red light. Since the blue micro-LED and the green micro-LED adopt a same wafer (usually a GaN-based wafer), and the red micro-LED adopts a different wafer (usually a GaP-based wafer), a manufacturing process for the blue micro-LED and the green micro-LED adopting the same wafer in the display panel will be simple and can save costs.

It should be noted that with reference to FIG. 4 and FIG. 5, since a light conversion efficiency of the red quantum dot conversion layer is smaller than a light conversion efficiency of the green quantum dot conversion layer, in order to balance an amount of red light generated by the blue micro-LED exciting the red quantum dot conversion layer and an amount of green light generated by the blue micro-LED exciting the green quantum dot conversion layer, the thickness of the red quantum dot conversion layer can be set to be greater than the thickness of the green quantum dot conversion layer. That is, the thickness of the second color quantum dot conversion layer 122 is set to be greater than the thickness of the third color quantum dot conversion layer 123.

Figure 7:
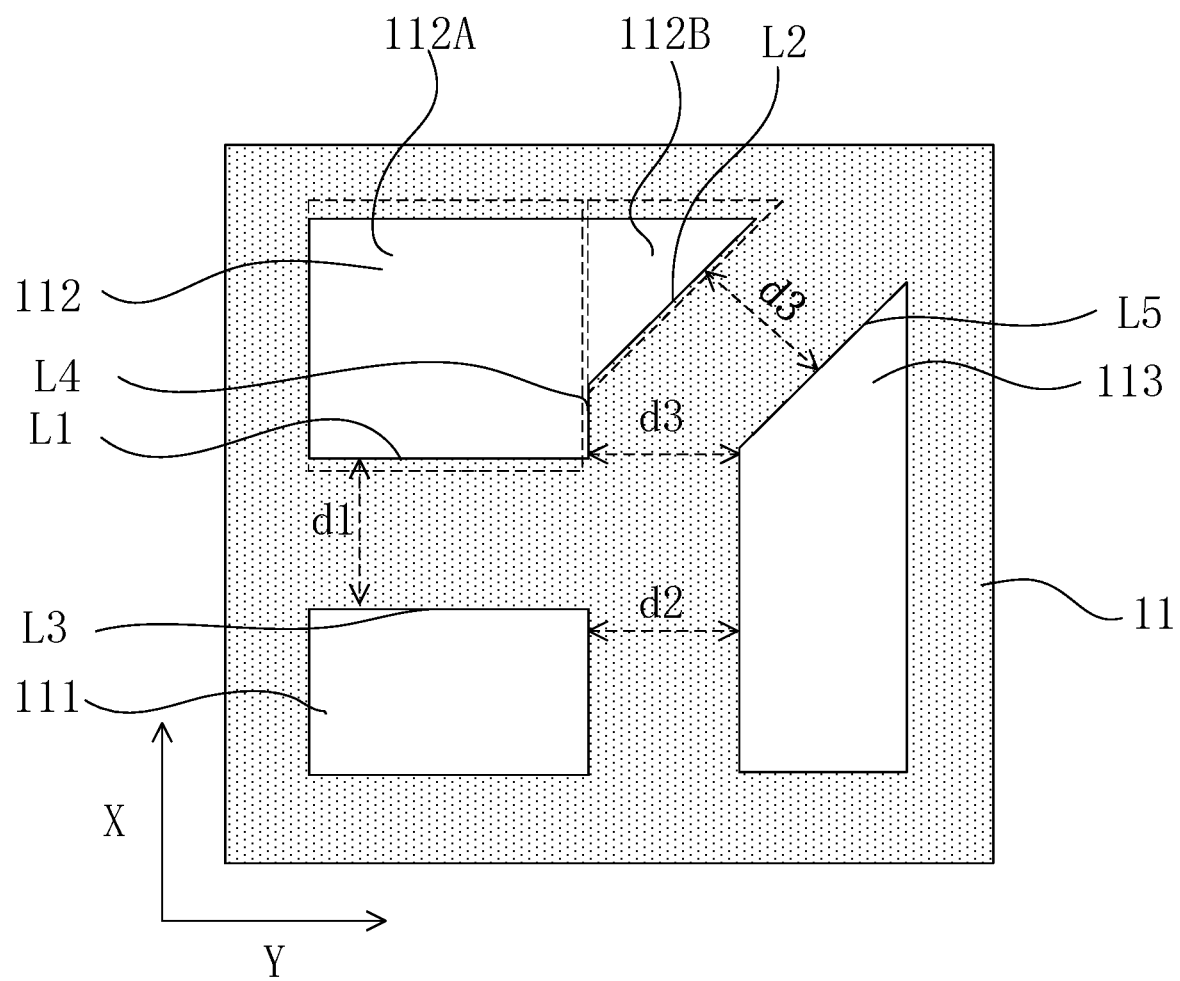
FIG. 7 is a schematic diagram of a light-shielding layer according to an embodiment of the present disclosure.

FIG. 7 is a schematic diagram of a light-shielding layer according to an embodiment of the present disclosure. As shown in FIG. 7, the second aperture 112 includes a first edge L1 and a second edge L2. The first edge L1 is adjacent to the first aperture 111, and an extending direction of the first edge L1 is parallel to the second direction Y. That is, the first edge L1 is an edge of the second aperture 112 parallel to the longer side of the first aperture 111 and adjacent to the first aperture 111. The second edge L2 is adjacent to the third aperture 113, and an angle between the second edge L2 and the first edge L1 is greater than 90° and smaller than 180°. That is, the second edge L2 is located at a side of the first edge L1 facing away from the first aperture 111 and close to the third aperture 113, and the second edge L2 is tilted towards the third aperture 113 in a direction facing away from the first edge L1. By having the second edge L2 of the second aperture 112 close to the third aperture 113 tilted towards the third aperture 113, the light-transmitting region of the second aperture 112 can be further increased, that is, the light-emitting area of the pixel corresponding to the second aperture 112 can be further increased.

Further, the first aperture 111 includes a third edge L3, the third edge L3 is adjacent to the second aperture 112, and an extending direction of the third edge L3 is parallel to the second direction Y. The third edge L3 is an edge of the first aperture 111 parallel to the longer side of the first aperture 111 and adjacent to the second aperture 112. That is, the third edge L3 of the first aperture 111 is adjacent to and parallel to the first edge L1 of the second aperture 112. A length of the first edge L1 is equal to a length of the third edge L3. As shown in FIG. 7, the left end of the second aperture 112 is aligned with the left side of the first aperture 111 in the first direction X.

With reference to FIG. 7, according to the above description, the second aperture 112 may be composed of a base portion 112A and a protruding portion 112B in the second direction Y. The protruding portion 112B is located at a side of the base portion 112A close to the third aperture 113, and the protruding portion 112B is located at a side of the first edge L1 facing away from the first aperture 111. Herein, a length of the base portion 112A of the second aperture 112 in the second direction Y is equal to a length of the first aperture 111 in the second direction Y. Further, the base 112A is aligned with the first aperture 111 in the first direction X, then the protruding portion 112B is equivalent to further increasing the area in a direction facing towards the third aperture 113 on a basis of the base portion 112A being aligned with the first aperture 11.

As shown in FIG. 7, in one pixel unit, in a case of a determined width of the shielding portion 11D, the length of the first aperture 111 and the width of the third aperture 113 determine the length of the pixel unit in the second direction Y. A sum of the length of the first aperture 111, the width of the third aperture 113, and the minimum value of the shielding portion 11D between the first aperture 111 and the third aperture 113 is the minimum length of the pixel unit in the second direction Y, and this minimum length determines a density of the pixel units. As analyzed above, the minimum length of the first aperture 111 may be substantially the same as the length of the first micro-LED 211, and the minimum width of the third aperture 113 may be substantially the same as the width of the third micro-LED 213. The length of the base portion 112A of the second aperture 112 in the second direction Y being substantially the same as the length of the first aperture 111 can still achieve that the pixel unit has a small length in the second direction Y.

However, since the second aperture 112 is provided with the second color quantum dot conversion layer, considering a limited light conversion efficiency of the quantum dot conversion layer, in order to provide the pixel corresponding to the second aperture 112 with a large brightness, the second aperture 112 can be designed to have a larger area. For example, although the width of the second aperture 112 in the first direction X is desired to increase, but the width of the pixel unit in the first direction X cannot be too large, which limits the width of the second aperture 112 in the first direction X. As an alternative shown in FIG. 7, the area of the second aperture 112 can be further increased by providing a protruding portion 112B at the right side of the base portion 112A of the second aperture 112 close to the third aperture 113.

With further reference to FIG. 7, the protruding portion 112B includes a first edge L2 close to the third aperture 113, the third aperture 113 includes a fifth edge L5 close to the second aperture 112, and the second edge L2 is parallel to the fifth edge L5. In other words, the second aperture 112 includes a protruding portion 112B close to the third aperture 113, and an avoidance structure is provided at a side of the third aperture 113 close to the second aperture 112, so that a spacing between the second aperture 112 and the third aperture 113 is also the third distance d3. The first distance d1, the second distance d2, and the third distance d3 are equal to each other. Therefore, even though the second aperture 112 and the third aperture 113 are tilted, the distance between the second aperture 112 and the third aperture 113 is still sufficient and equal to the distance between other pixels, so that each of the shielding portions 11D having a same width can be provided between adjacent apertures.

The shielding portion that extends obliquely with respect to the first direction X and the second direction Y is provided, so that each shielding portion between adjacent pixels in the pixel unit has a same width, and a region of the aperture where no micro-LED is provided can be assigned to the second aperture 112 and third aperture 113 as needed. On the one hand, the light output of the pixels corresponding to the second aperture 112 and the third aperture 113 can be adjusted. On the other hand, stability of the structure can be improved. That is, instability caused by lack of support due to the excessively large second aperture 112 or third aperture 113 can be avoided.

Figure 8:
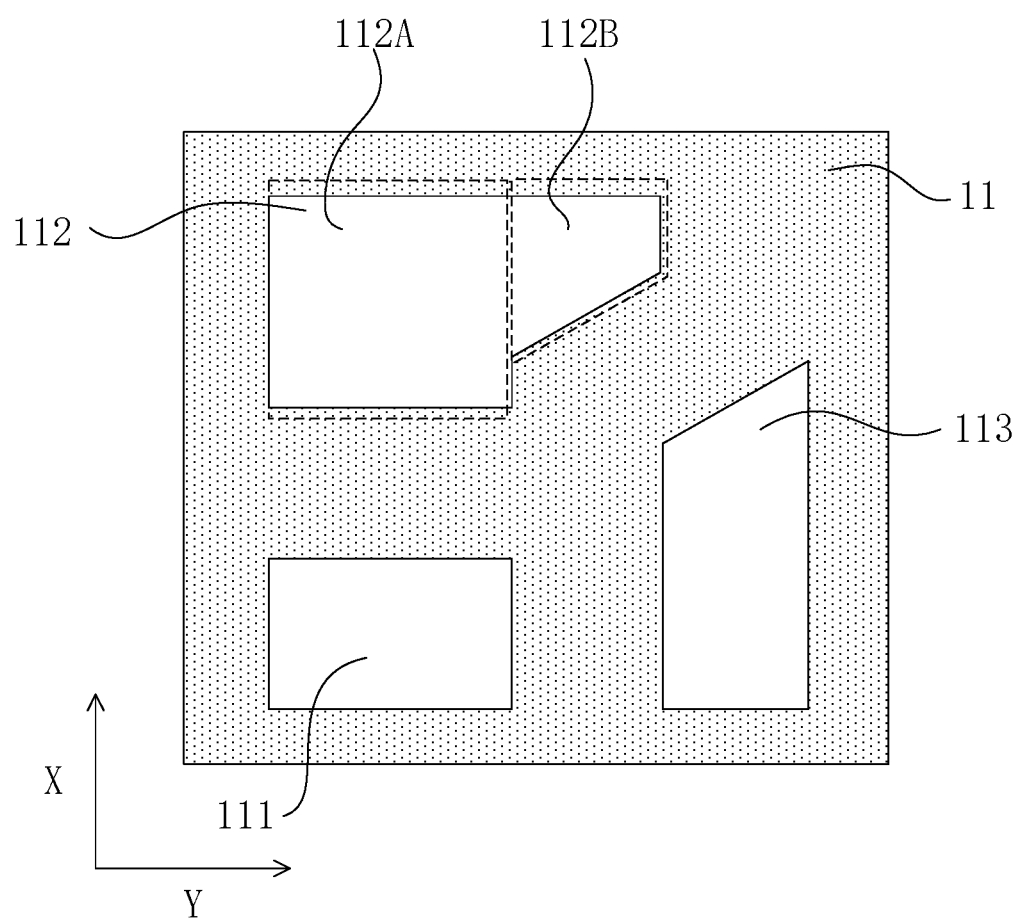
FIG. 8 is a schematic diagram of another light-shielding layer according to an embodiment of the present disclosure.

As shown in FIG. 7, the first aperture 111 has a rectangular shape, and the base portion 112A of the second aperture 112 also has a rectangular shape. It should be noted that the shape of the first aperture 111 and the shape of the base portion 112A of the second aperture 112 may be other shapes. In addition, as shown in FIG. 7, the protruding portion 112B has a triangular shape. FIG. 8 is a schematic diagram of another light-shielding layer according to an embodiment of the present disclosure. As shown in FIG. 8, the protruding portion 112B may have a trapezoidal shape. In addition, the shape of the protruding portion 112B may also be a rectangular shape or another shape.

Further, with further reference to FIG. 7, the second aperture 112 further includes a fourth edge L4 connecting the first edge L1 with the second edge L2, and the fourth edge L4 is parallel to the first direction X. In other words, the fourth edge L4 may be perpendicular to the first edge L1, and the second edge L2 may not be tilted towards the third aperture 113 from the first edge L1. The second edge L2 may be tilted towards the third aperture 113 from a position having a certain distance from the first edge L1 in the first direction X. That is, the second edge L2 is tilted towards the third aperture 113 from an end of the fourth edge L4 facing away from the first edge L1. It should be noted that, it is also possible that the second edge L2 is tilted towards the third aperture 113 from the first edge L1. That is, the second edge L2 is connected to an end of the first edge L1 close to the third aperture 113 and tilted towards the third aperture 113.

Figure 9:
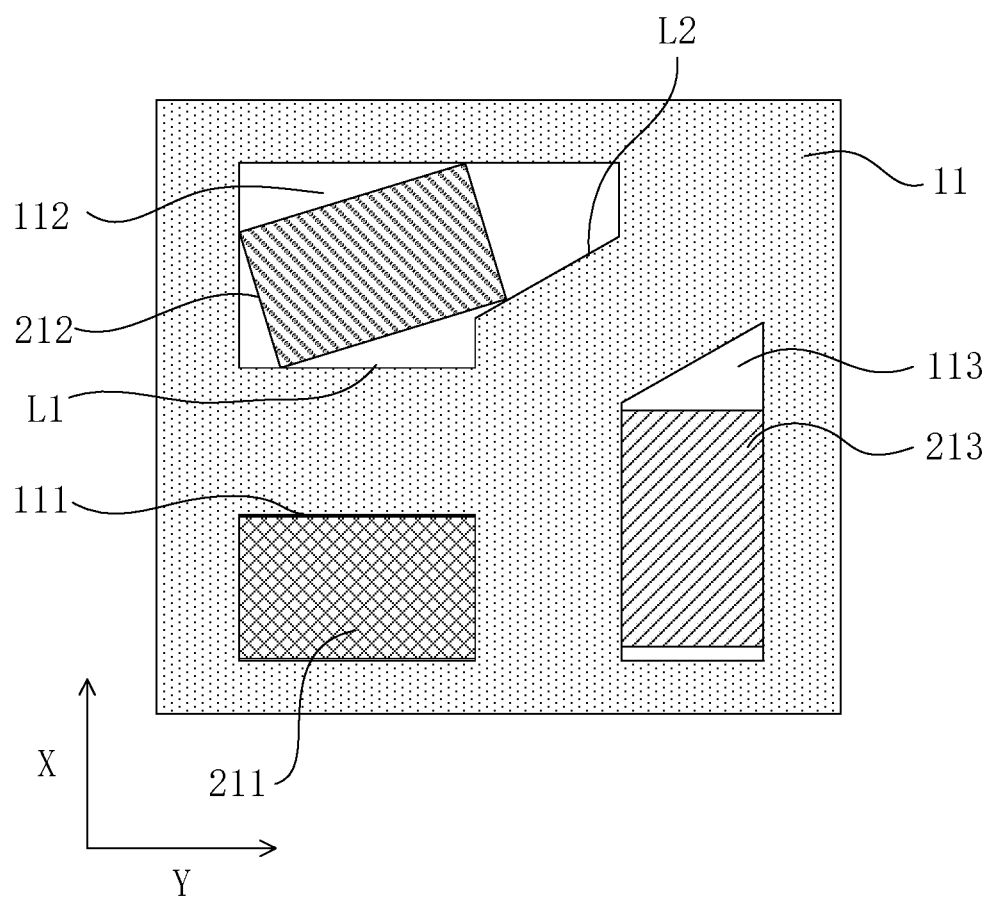
FIG. 9 is a schematic diagram of a part of another display panel according to an embodiment of the present disclosure.

FIG. 9 is a schematic diagram of a part of another display panel according to an embodiment of the present disclosure. As shown in FIG. 9, when the second aperture 112 has a second edge L2 tilted towards the third aperture 113, the second micro-LED 212 can be tilted relative to the first edge L1 towards a direction close to the second edge L2. It can be seen that an angle between the longer side of the second micro-LED 212 and the first edge L1 is greater than 90° and smaller than 180°, and an angle between the longer side of the second micro-LED 212 and the second edge L2 is smaller than 90°. A tilting direction of the second micro-LED 212 relative to the first edge L1 and the third aperture 113 is substantially the same as a tilting direction of the second edge L2 relative to the first edge L1 and the third aperture 113. Since a tilting manner of the second edge L2 of the second aperture 112 allows an end of the second edge L2 facing away from the first edge L1 to be far from a center of the second aperture 112, the tilting manner of the second micro-LED 212 being substantially the same as a tilting manner of the second edge L2 can prevent a distance between the second micro-LED 212 and any edge of the second aperture 112 from being too large. Therefore, the light emitted by the second micro-LED 212 is not too far away from any position of the second color quantum dot conversion layer 122 to be excited, so that the second color quantum dot conversion layer 122 has substantially the same light conversion efficiency at any position of the second color quantum dot conversion layer 122. In this way, a required light conversion efficiency and color uniformity can be achieved.

The lower light conversion efficiency of the red quantum dot conversion layer leads to a demand for a larger light-emitting area. In the embodiment shown in FIG. 7, a tilted shielding portion 11D and a tilted second micro-LED are provided outside the second aperture 112 corresponding to the red quantum dot conversion layer. That is, the second micro-LED not only rotates relative to the first micro-LED, but also rotates relative to the direction of the aperture, and the aperture can be provided freely around the second micro-LED. Therefore, the red light being emitted from the second aperture is smoother than from the first micro-LED and the second micro-LED. Meanwhile, the longer side of the third micro-LED rotates 90 degrees relative to the first micro-LED. Without changing an overall contour of the pixel unit, the aperture of the third micro-LED is increased relative to the first micro-LED, and the third micro-LED does not rotate relative to the aperture like the second micro-LED does. Therefore, light output smoothness of the green light is between light output smoothness of the blue light and light output smoothness of the red light, which facilitates achieving a balance of light outputs of the pixels corresponding to the quantum dot conversion layers having different light conversion efficiencies.

With further reference to FIG. 4 and FIG. 5, the display panel further includes a first color filter layer 131, a second color filter layer 132, and a third color filter layer 133. The first color filter layer 131 is arranged in the first aperture 111, the second color filter layer 132 is arranged in the second aperture 112, and the third color filter layer 133 is arranged in the third aperture 113. That is, the second color filter layer 132 correlates to the second color quantum dot conversion layer 122, and the third color filter layer 133 correlates to the third color quantum dot conversion layer 123. With reference to FIG. 4 and FIG. 5, the second color filter layer 132 is arranged at a side of the second color quantum dot conversion layer 122 facing towards a light-emitting side of the display panel, the third color filter layer 133 is arranged at a side of the third color quantum dot conversion layer 123 facing towards the light-emitting side of the display panel, and the first color filter layer 131 is arranged in the first aperture 111. The light of the first color emitted by the micro-LED has a narrower wavelength range after passing through the first color filter layer 131. The light of the second color that is formed by the light of the first color exciting the second quantum dot conversion layer 122 has a narrower wavelength range after passing through the second color filter layer 132. The light of the third color that is formed by the light of the first color exciting the third quantum dot conversion layer 123 has a narrower wavelength range after passing through the third color filter layer 133.

Figure 10:
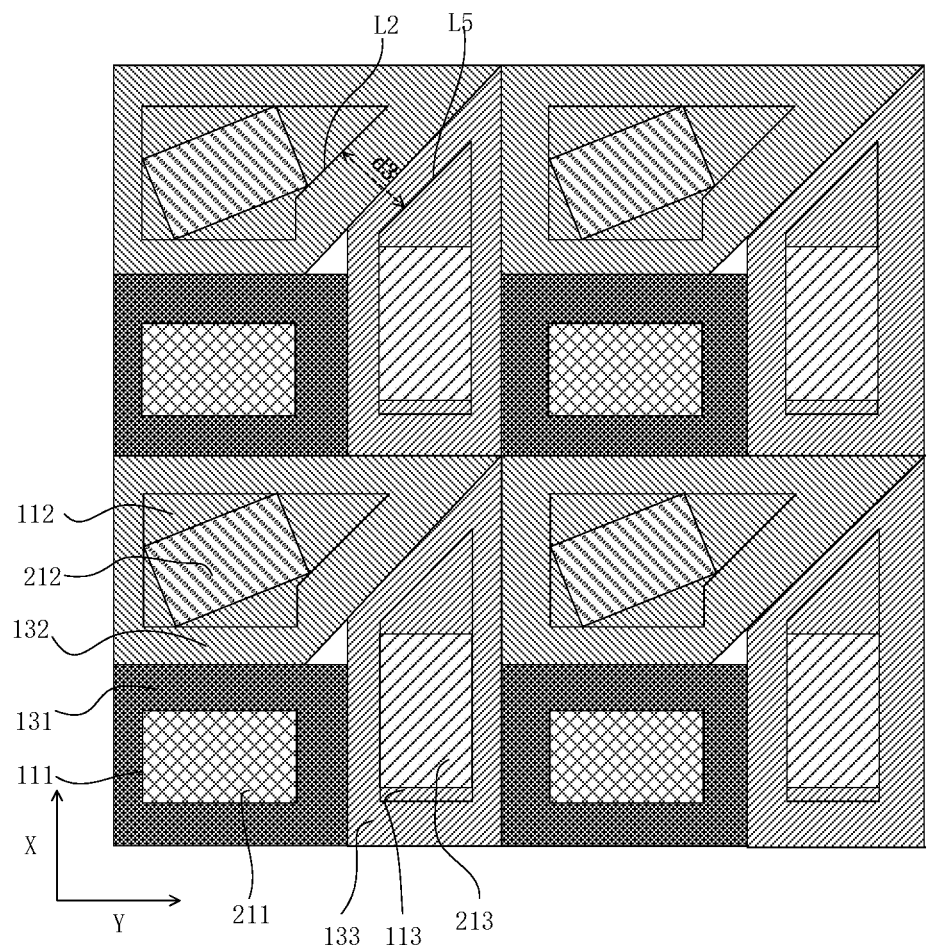
FIG. 10 is a top view of a part of a display panel according to an embodiment of the present disclosure.

It should be noted that the first color filter layer 131 can cover the first aperture 111, that is, a projection of the first color filter layer 131 onto a plane of the display panel covers the first aperture 111, and they have substantially the same contour. The second color filter layer 132 can cover the second aperture 112, that is, a projection of the second color filter layer 132 onto the plane of the display panel covers the second aperture 112, and they have substantially the same contour. The third color filter layer 133 can cover the third aperture 113, that is, a projection of the third color filter layer 133 onto the plane of the display panel covers the third aperture 113, and they have substantially the same contour. FIG. 10 is a top view of a part of a display panel according to an embodiment of the present disclosure. As shown in FIG. 10, the projection of the first color filter layer 131 onto the plane of the display panel has a rectangular shape, the projection of the second color filter layer 132 onto the plane of the panel has a trapezoidal shape, and the projection of the third color filter layer 133 onto the plane of the display panel has a trapezoidal shape. A bevel edge of the trapezoidal shape corresponding to the second color filter layer 132 is adjacent to and parallel to a bevel edge of the trapezoidal shape corresponding to the third color filter layer 133.

With further reference to FIG. 10, it can be seen that in one pixel unit, the first aperture 111, the second aperture 112, and the third aperture 113 each have a contour of a rectangular shape, and the first color filter layer 131, the second color filter layer 132, and the third color filter layer 133 each have a contour of a rectangular shape. It should be noted that, in one pixel unit, the contour of the first aperture 111, the second aperture 112, and the third aperture 113 may be of another shape, and the contour of the first color filter layer 131, the second color filter layer 132, and the third color filter layer 133 may also be of another shape. The shape of the contour should be consistent with a shape of the pixel unit. In this embodiment of the present disclosure, a change of the shape of the aperture in the pixel unit mainly involves changing its edges adjacent to the adjacent apertures, such as changing the second edge L2 and the fifth edge L5 while having the shape of an outer edge unchanged. A change of the shape of the light filter layer adapts to the changing of the shape of the aperture.

Figure 11:
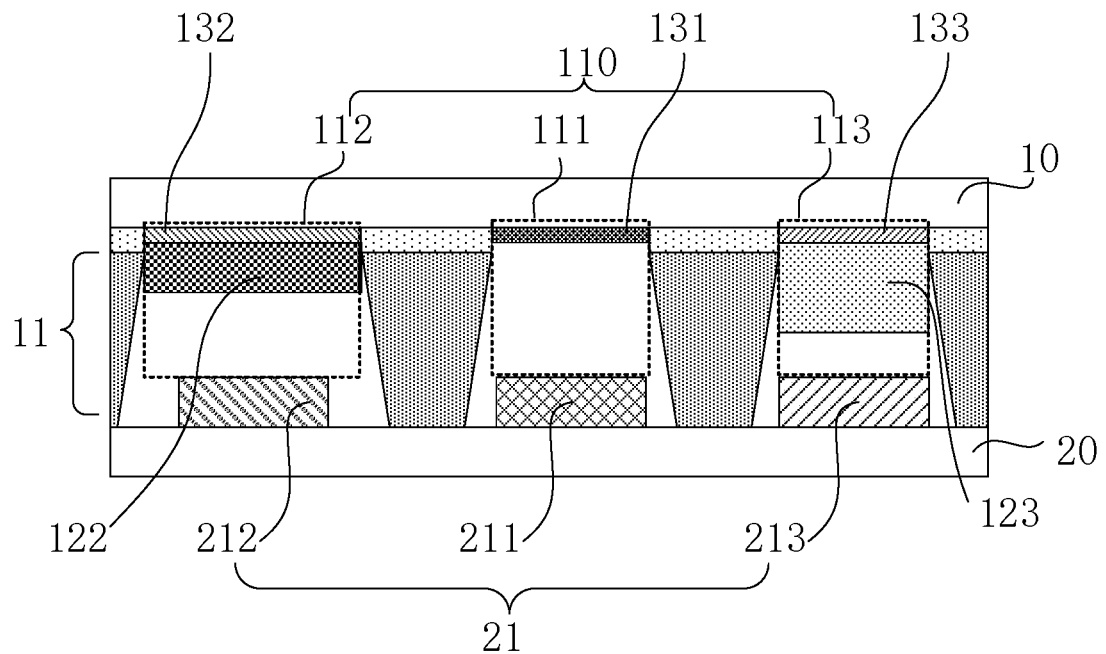
FIG. 11 is a cross-sectional view of a part of still another display panel according to an embodiment of the present disclosure.

In an embodiment of the present disclosure, the wavelength of the light of the third color is greater than the wavelength of the light of the second color, and the area of the third aperture 113 is greater than the area of the second aperture 112. In an example, the light of the first color is blue light, the light of the second color is green light, and the light of the third color is red light. In this case, the micro-LED is a blue micro-LED that emits blue light, the second color quantum dot conversion layer 122 is a green quantum dot conversion layer and correlates to the second micro-LED 212, and the third color quantum dot conversion layer 123 is a red quantum dot conversion layer and correlates to the third micro-LED 213. FIG. 11 is a cross-sectional view of a part of still another display panel according to an embodiment of the present disclosure. Correspondingly, the second micro-LED 212 excites the green quantum dot conversion layer to cause the pixel corresponding to the second aperture 112 to emit green light, and the third micro-LED 213 excites the red quantum dot conversion layer 123 to cause the pixel corresponding to the third aperture 113 to emit red light. In addition, the first aperture 111 may be provided with no quantum dot conversion layer therein, and the blue light emitted by the first micro-LED 211 may cause the pixel corresponding to the first aperture 111 to emit blue light. By setting the third aperture 113 corresponding to the light of the third color that has the largest wavelength to have a maximum area, the brightness of the light of the second color that has a low energy can be increased, thereby facilitating adjustment of white light.

With further reference to FIG. 11, since the light conversion efficiency of the red quantum dot conversion layer is smaller than the light conversion efficiency of the green quantum dot conversion layer, in order to balance an amount of red light generated by the blue micro-LED exciting the red quantum dot conversion layer and an amount of green light generated by the blue micro-LED exciting the green quantum dot conversion layer, a thickness of the red quantum dot conversion layer may be set to be greater than a thickness of the green quantum dot conversion layer. That is, the thickness of the third color quantum dot conversion layer 123 is set to be greater than the thickness of the second color quantum dot conversion layer 122.

Figure 12:
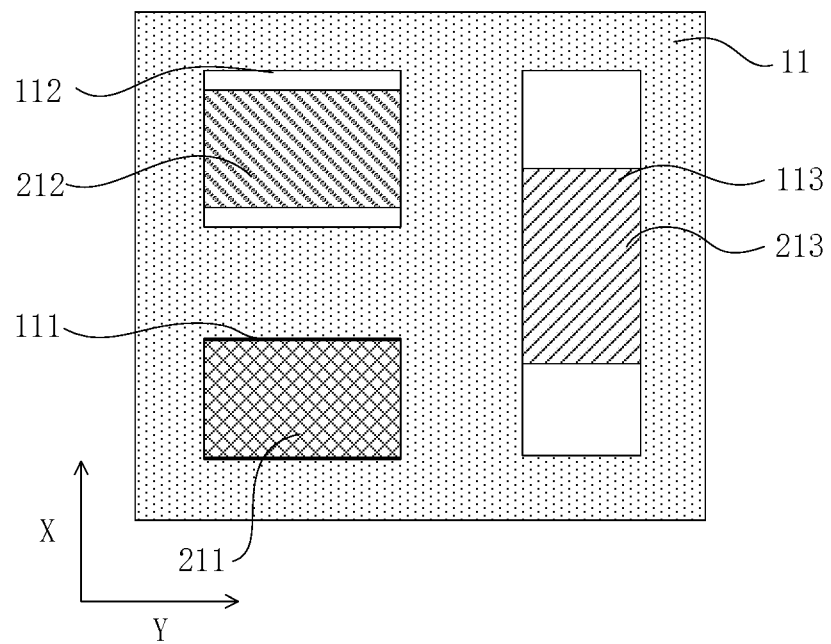
FIG. 12 is a schematic diagram of a part of still another display panel according to an embodiment of the present disclosure.

FIG. 12 is a schematic diagram of a part of still another display panel according to an embodiment of the present disclosure. As shown in FIG. 12, when the wavelength of the light of the third color is greater than the wavelength of the light of the second color, the length of the second aperture 112 in the second direction Y is equal to the length of the first aperture 112 in the second direction Y. Further, the length of the second aperture 112 and the length of the first aperture 111 in the second direction each are equal to the length of the micro-LED, and the second aperture 112 is aligned with the first aperture 111 in the first direction X. In this case, by adjusting the width of the second aperture 112 in the first direction X, the area of the second aperture 112 can be increased to be greater than the area of the first aperture 111. Since the length of the first aperture 111 is equal to the length of the second aperture 112 and the first aperture 111 is aligned with the second aperture 112 in the first direction X, the length of the third aperture 113 located at a side of the first aperture 111 and the second aperture 112 in the second direction Y can be adjusted in the first direction X, and there is sufficient space for adjusting the length, so as to allow the area of the third aperture 113 to be increased to a suitable area. In an example, a distance between an edge of the first aperture 111 facing away from the second aperture 112 and an edge of the second aperture 112 facing away from the first aperture 111 is equal to the length of the third aperture 113 in the first direction X. Further, since the conversion efficiency of the red quantum dot conversion layer is lower than the conversion efficiency of the green quantum dot conversion layer, and energy of red light is smaller than energy of green light, the pixel corresponding to the red quantum dot conversion layer is required to have a greater light-emitting area. In a case of a substantially determined length of the pixel unit in the first direction X, the width of the third aperture 113 can be appropriately increased to increase the light-emitting area of the pixel corresponding to the third aperture 113. In a case of a substantially determined length of the pixel unit in the first direction Y, the width of the second aperture 112 in the first direction X can be appropriately increased. Correspondingly, the length of the third aperture 113 in the first direction X can be increased, so as to increase the light-emitting area of the pixel corresponding to the third aperture 113.

With further reference to FIG. 4 and FIG. 5, the display panel further includes a black matrix 14 located between the apertures. The black matrix 14 is made of a black material which can absorb light. Thus, the black matrix 14 is located to be closer to the light-emitting side of the display panel, i.e., the black matrix 14 may be located at a side of the shielding layer 11 close to the light-emitting side of the display panel, so as to absorb large-angle light that is to be emitted from the display panel and is close to a position between pixels, thereby avoiding mixing of different colors between adjacent pixels.

The shielding portion 11D is located to be closer to the micro-LED, which can prevent light of the first color emitted by a micro-LED corresponding to one pixel from deviating to a position of another pixel. Moreover, the shielding portion 11D is a light reflective structure that can reflect large-angle light emitted by the micro-LED corresponding to one pixel, in such a manner that the large-angle light may arrive at the corresponding aperture, thereby improving a light-emitting efficiency thereof.

In addition, the thickness of the shielding portion 11D should be larger greater the thickness of the red quantum dot conversion layer and greater than the thickness of the green quantum dot conversion layer 122, so that the light of the first color light emitted by one micro-LED can only arrive at the corresponding aperture of the micro-LED, thereby improving a resolution rate thereof.

Figure 13:
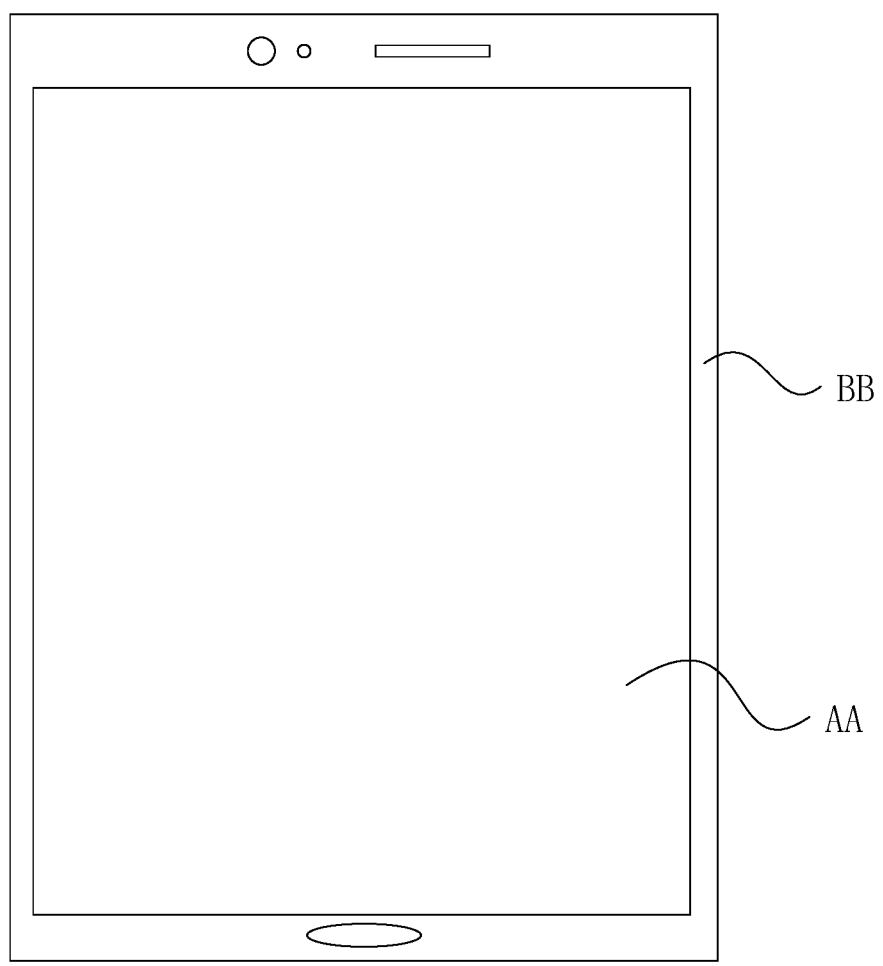
FIG. 13 is a schematic diagram of a display device according to an embodiment of the present disclosure.

FIG. 13 is a schematic diagram of a display device according to an embodiment of the present disclosure. The display device includes the display panel according to any one of the embodiments described above. As shown in FIG. 13, the display device according to this embodiment of the present disclosure may be a mobile phone. In addition, the organic light-emitting display device according to this embodiment of the present disclosure may also be a display device such as a computer or a television. The display device according to this embodiment of the present disclosure includes a display area AA for display and a non-display area BB surrounding the display area AA. The micro-LED and the shielding layer of the display panel are each located at a position corresponding to the display area AA.

For the display device according to this embodiment of the present disclosure, a part of the micro-LEDs have different longer sides, so that in a case of a determined area of the pixel area, a sufficient spacing between the micro-LEDs can be achieved by providing a reasonable arrangement of the micro-LEDs. In this way, the shielding portion having an appropriate width can be provided, thereby avoiding the color mixing problem.

The above-described embodiments are merely preferred embodiments of the present disclosure and are not intended to limit the present disclosure. Any modifications, equivalent substitutions and improvements made within the principle of the present disclosure shall fall into the protection scope of the present disclosure.

What is claimed is:

1. A display panel, comprising:
   a base substrate;
   a plurality of micro-LED groups located on the base substrate, wherein each of the plurality of micro-LED groups comprises at least three micro-LEDs, and wherein at least two micro-LEDs in each said micro-LED group have their longer sides arranged in different directions; and
   a shielding layer comprising a plurality of apertures located in shielding portions, wherein the shielding portions are located between adjacent micro-LEDs, and wherein the plurality of apertures each correlates one of the micro-LEDs,
   wherein the plurality of apertures is divided into aperture groups, each said aperture group has one-to-one relationship to one of the plurality of micro-LED groups;
   wherein each said aperture group comprises a first aperture, a second aperture, and a third aperture; wherein the first aperture correlates to the first micro-LED, the second aperture correlates to the second micro-LED, and the third aperture correlates to the third micro-LED; and
   wherein the second aperture comprises a first edge and a second edge; and the first edge is adjacent to the first aperture, and the first edge extends along the second direction; the second edge is adjacent to the third aperture, and an angle between the second edge and the first edge is greater than 90° and smaller than 180°.

2. The display panel according to claim 1, wherein the shielding portions located between adjacent micro-LEDs in one of the plurality of micro-LED groups have a same width.

3. The display panel according to claim 2, wherein for two adjacent apertures of the plurality of apertures corresponding to one of the plurality of micro-LED groups, an edge of one aperture and an edge of the other aperture that are adjacent to each other are parallel to each other.

4. The display panel according to claim 1,
wherein a first micro-LED, a second micro-LED, and a third micro-LED of the at least three micro-LEDs in one micro-LED group are respectively arranged at three vertices of a triangle, wherein a longer side of the third micro-LED is parallel to a first direction, a longer side of the first micro-LED is parallel to a second direction, and the first direction intersects the second direction.

5. The display panel according to claim 4, wherein the micro-LEDs of the plurality of micro-LED groups are arranged in an array; wherein the first micro-LED and the second micro-LED are alternately arranged in the first direction to form a first pixel column, and the third micro-LEDs are arranged in the first direction to form a second pixel column; wherein the first pixel column and the second pixel column are alternately arranged in the second direction; and wherein the third micro-LED correlates, in the second direction, to a spacing between the first micro-LED and the second micro-LED.

6. The display panel according to claim 4, wherein each of the first micro-LED, the second micro-LED, and the third micro-LED emits light of a first color;
wherein the display panel further comprises a quantum dot conversion layer of a second color and a quantum dot conversion layer of a third color, wherein the quantum dot conversion layer of the second color correlates to the second micro-LED, and the quantum dot conversion layer of the third color correlates to the third micro-LED;
wherein the quantum dot conversion layer of the second color is excited by the light of the first color to emit light of the second color, and the quantum dot conversion layer of the third color is excited by the light of the first color to emit light of the third color; and
wherein a wavelength of the first color, a wavelength of the second color and a wavelength of the third color are different from each other, and the wavelength of the first color is shorter than the wavelength of the second color and further shorter than the wavelength of the third color.

7. The display panel according to claim 6, wherein the shielding portions reflect light.

8. The display panel according to claim 6, wherein a thickness of the shielding portions is greater than a thickness of a quantum dot conversion layer of the first color and also greater than a thickness of the quantum dot conversion layer of the second color.

9. The display panel according to claim 6,
wherein an area of the first aperture is smaller than an area of the second aperture and further smaller than an area of the third aperture.

10. The display panel according to claim 9, wherein the wavelength of the second color is greater than the wavelength of the third color; and
wherein the area of the second aperture is greater than the area of the third aperture.

11. The display panel according to claim 9, wherein the wavelength of the third color is greater than the wavelength of the second color; and
wherein the area of the third aperture is greater than the area of the second aperture.

12. The display panel according to claim 11, wherein a length of the second aperture in the second direction is equal to a length of the first aperture in the second direction.

13. The display panel according to claim 9, wherein the first aperture is longer in the second direction than in the first direction, and wherein the third aperture is longer in the first direction than in the second direction.

14. The display panel according to claim 13, wherein the first aperture and the first micro-LED have a same length in the second direction; and wherein the third aperture and the third micro-LED have a same length in the second direction.

15. The display panel according to claim 1, wherein the first aperture comprises a third edge, the third edge is adjacent to the second aperture, the third edge extends along the second direction, and a length of the first edge is equal to a length of the third edge.

16. The display panel according to claim 1, wherein the second aperture further comprises a fourth edge connecting the first edge with the second edge of the second aperture, and wherein the fourth edge extends along the first direction.

17. The display panel according to claim 1, wherein the second micro-LED is tilted towards the second edge with respect to the first edge.

18. The display panel according to claim 1, further comprising a first color filter layer, a second color filter layer and a third color filter layer,
wherein the first color filter layer is arranged in the first aperture, the second color filter layer is arranged in the second aperture, and the third color filter layer is arranged in the third aperture, and
wherein a projection of the first color filter layer onto a plane of the display panel has a rectangular shape, a projection of the second color filter layer onto the plane of the display panel has a trapezoidal shape, and a projection of the third color filter layer onto the plane of the display panel has a trapezoidal shape, wherein bevel edges of the trapezoidal shape corresponding to the second color filter layer and the trapezoidal shape corresponding to the third color filter layer are adjacent to each other.

19. A display device, comprising a display panel, wherein the display panel comprises:
a base substrate;
a plurality of micro-LED groups located on the base substrate, wherein each of the plurality of micro-LED groups comprises at least three micro-LEDs, and at least two micro-LEDs in each said micro-LED group have their longer sides arranged in different directions; and
a shielding layer comprising a plurality of apertures located in shielding portions, wherein the shielding portions are located between adjacent micro-LEDs, and wherein the plurality of apertures each correlates one of the micro-LEDs,
wherein the plurality of apertures is divided into aperture groups, each said aperture group has one-to-one relationship to one of the plurality of micro-LED groups;
wherein each said aperture group comprises a first aperture, a second aperture, and a third aperture; wherein the first aperture correlates to the first micro-LED, the second aperture correlates to the second micro-LED, and the third aperture correlates to the third micro-LED; and
wherein the second aperture comprises a first edge and a second edge; and the first edge is adjacent to the first aperture, and the first edge extends along the second direction; the second edge is adjacent to the third aperture, and an angle between the second edge and the first edge is greater than 90° and smaller than 180°.

* * * * *